United States Patent
Grill et al.

[11] Patent Number: 5,981,000
[45] Date of Patent: Nov. 9, 1999

[54] METHOD FOR FABRICATING A THERMALLY STABLE DIAMOND-LIKE CARBON FILM

[75] Inventors: Alfred Grill, White Plains; Christopher Vincent Jahnes, Monsey; Vishnubhai Vitthalbhai Patel, Yorktown Heights, all of N.Y.

[73] Assignee: International Business Machines Corporation, Armonk, N.Y.

[21] Appl. No.: 09/058,651

[22] Filed: Apr. 10, 1998

Related U.S. Application Data

[60] Provisional application No. 60/061,838, Oct. 14, 1997.
[51] Int. Cl.$^6$ .............................. B05D 3/06; C23C 16/26
[52] U.S. Cl. .................. 427/577; 427/249.7; 427/372.2; 427/904; 427/902
[58] Field of Search ..................................... 427/577, 249, 427/372.2, 249.7, 904, 902; 423/446

[56] References Cited

U.S. PATENT DOCUMENTS

| | | | |
|---|---|---|---|
| 5,569,501 | 10/1996 | Bailey et al. | 427/577 |
| 5,674,355 | 10/1997 | Cohen et al. | 156/652.1 |

FOREIGN PATENT DOCUMENTS 3-256220  11/1991  Japan.

OTHER PUBLICATIONS

Hirakuri et al, Thin Solid Films 302(1997 No month data!) p. 5–11.

*Primary Examiner*—Roy V. King

[57] ABSTRACT

A method for fabricating a thermally stable carbon-based low dielectric constant film such as a hydrogenated amorphous carbon film or a diamond-like carbon film in a parallel plate chemical vapor deposition process utilizing plasma enhanced chemical vapor deposition process is disclosed. Electronic devices containing insulating layers of thermally stable carbon-based low dielectric constant materials that are prepared by the method are further disclosed. In order to render the carbon-based low dielectric constant film thermally stable, i.e., at a temperature of at least 400° C., the films are heat treated at a temperature of not less than 350° C. for at least 0.5 hour. To enable the fabrication of thermally stable carbon-based low dielectric constant film, specific precursor materials such as cyclic hydrocarbons should be used, for instance, cyclohexane or benzene. The geometry of the chemical vapor deposition chamber is important in making the present invention thermally stable low dielectric constant films in order to achieve a specific bias voltage on the substrate onto which the electronic structure is formed.

10 Claims, 2 Drawing Sheets

METHOD FOR FABRICATING A THERMALLY STABLE DIAMOND-LIKE CARBON FILM

This application claims benefit of provisional application 60/061,838, filed Oct. 14, 1997.

FIELD OF THE INVENTION

The present invention generally relates to a method for fabricating a thermally stable diamond-like carbon film and electronic device containing such film and more particularly, relates to a method for fabricating a thermally stable diamond-like carbon (DLC) film for use as an intralevel or interlevel dielectric in a ULSI back-end-of-the-line (BEOL) wiring structure and electronic structures formed by such method.

BACKGROUND OF THE INVENTION

Amorphous hydrogenated carbon (a-C:H), also known as diamond-like carbon for its superior hardness, has many useful properties such as chemical inertness, high wear resistance, high resistivity and low dielectric constant (k<3.6). For instance, in a paper "Diamond-Like Carbon Materials As Low-k Dielectrics" published in Proc. Advanced Metalization and Interconnect Systems for ULSI Applications (1996), by Materials Research Society, Pittsburgh, Pa. 1997, such desirable properties were discussed. DLC films can be fabricated by a variety of techniques including physical vapor deposition or sputtering, ion beam sputtering and DC or RF plasma assisted chemical vapor deposition with precursors of a variety of carbon-bearing source materials. U.S. Pat. No. 5,559,369, assigned to some of the common assignees of the present invention, further discloses diamond-like carbon for use in VLSI and ULSI interconnect systems.

The continuous shrinking in dimensions of electronic devices utilized in ULSI circuits in recent years has resulted in increasing the resistance of the back-end-of-the-line (BEOL) metalization as well as increasing of the intralayer and interlayer capacitances. This combined effect increases signal delays in ULSI electronic devices. In order to improve the switching performances of future ULSI circuits, low dielectric constant insulators and particularly those with k significantly lower than that of silicon oxide are needed to reduce the capacitances. Dielectric materials that have low k values are available, for instance, polytetrafluoroethylene (PTFE) with k value of 2.0. However, these dielectric materials are not stable at temperatures above 300˜350° C. which renders them useless during integration of these dielectrics in ULSI chips which require thermal stability at temperatures of at least 400° C. DLC materials have been previously considered as a possible low-k dielectric, however, the films have either been found not stable at temperatures above 300° C., or have dielectric constants significantly higher than 3.6.

It is therefore an object of the present invention to provide a method for fabricating a thermally stable carbon-based low dielectric constant film that does not have the drawbacks or shortcomings of the conventional methods.

It is another object of the present invention to provide a method for fabricating a thermally stable carbon-based low dielectric constant film from a cyclic hydrocarbon precursor.

It is a further object of the present invention to provide a method for fabricating a thermally stable carbon-based low dielectric constant film in a parallel plate plasma enhanced chemical vapor deposition chamber.

It is another further object of the present invention to provide a method for fabricating a thermally stable diamond-like carbon film of low dielectric constant for use in electronic structures as an intralevel or interlevel dielectric in a back-end-of-the-line interconnect structure.

It is still another object of the present invention to provide a method for fabricating a thermally stable diamond-like carbon film of low dielectric constant capable of sustaining a process temperature of at least 350° C. for four hours.

It is yet another object of the present invention to provide a thermally stable diamond-like carbon film of low dielectric constant that has low internal stresses and a dielectric constant of not higher than 3.6.

It is still another further object of the present invention to provide an electronic structure incorporating layers of insulating materials as intralevel or interlevel dielectrics in a back-end-of-the-line wiring structure in which at least two of the layers of insulating materials comprise diamond-like carbon film.

It is yet another further object of the present invention to provide an electronic structure which has layers of diamond-like carbon films as intralevel or interlevel dielectrics in a back-end-of-the-line wiring structure which further contains at least one dielectric cap layer as a RIE MASK polish stop or a diffusion barrier.

SUMMARY OF THE INVENTION

In accordance with the present invention, a method for fabricating a thermally stable carbon-based low dielectric constant film such as a hydrogenated amorphous carbon or diamond-like carbon film by reacting a precursor gas of cyclic hydrocarbon in a parallel plate chemical vapor deposition chamber is provided. The present invention further provides an electronic structure that has layers of insulating materials as intralevel or interlevel dielectrics used in a back-end-of-the-line wiring structure wherein the insulating material can be a hydrogenated amorphous carbon or a diamond-like carbon film.

In a preferred embodiment, a method for fabricating a thermally stable carbon-based low dielectric constant film can be carried out by the operating steps of first providing a parallel plate plasma enhanced chemical vapor deposition chamber, positioning an electronic structure in the chamber, flowing a precursor gas of a cyclic hydrocarbon into the chamber, depositing a carbon-based low dielectric constant film on the substrate, and heat treating the film at a temperature not less than 300° C. for a time period of at least 0.5 hour. The method may further consist the step of providing a parallel plate reactor which has a conductive area of a substrate chuck between about 300 $cm^2$ and about 700 $cm^2$, and a gap between the substrate and a top electrode between about 1 cm and about 10 cm. A RF power is applied to the substrate at a frequency between about 12 MHZ and about 15 MHZ. The heat treating step may further be conducted at a temperature not higher than 300° C. for a first time period and then at a temperature not lower than 380° C. for a second time period, the second time period is longer than the first time period. The second time period may be at least 10 folds of the first time period. The cyclic hydrocarbon utilized can be selected from either cyclohexane or benzene. The carbon-based low dielectric constant film can be of either a hydrogenated amorphous carbon or a diamond-like carbon.

The deposition step for the carbon-based low dielectric constant film may further include the steps of setting the substrate temperature at between about 25° C. and about 325° C., setting the RF power density at between about 0.05

W/cm² and about 1.0 W/cm², setting the precursor flow rate at between about 5 sccm and about 200 sccm, setting the chamber pressure at between about 50 m Torr and about 500 m Torr, and setting a substrate DC bias between about −50 VDC and about −600 VDC. The deposition process can be conducted in a parallel plate type plasma enhanced chemical vapor deposition chamber. When the conductive area of the substrate chuck is changed by a factor X, the RF power applied to the substrate chuck is also changed by a factor of X.

In another preferred embodiment, a method for fabricating a thermally stable diamond-like carbon film can be carried out by the operating steps of first providing a parallel plate type chemical vapor deposition chamber that has plasma enhancement, then positioning a pre-processed wafer on a substrate chuck which has a conductive area of between about 300 cm² and about 700 cm² and maintaining a gap between the wafer and a top electrode between about 1 cm and about 10 cm, flowing a precursor gas of a cyclic hydrocarbon into the chamber, and depositing a diamond-like carbon film on the wafer. The process may further include the step of heat treating the film after the deposition step at a temperature of not less than 300° C. for at least 0.5 hour. The process may further include the step of applying a RF power to the wafer. The heat treating step may further be conducted at a temperature of not higher than 300° C. for a first time period and then at a temperature not lower than 380° C. for a second time period, the second time period is longer than the first time period. The second time period may be at least 10 folds of the first time period. The cyclic hydrocarbon precursor utilized can be either cyclohexane or benzene. The deposition step for the diamond-like carbon film may further include the steps of setting the wafer temperature at between about 25° C. and about 325° C., setting a RF power density at between about 0.05 W/cm² and about 1.0 W/cm², setting the precursor gas flow rate at between about 5 sccm and about 200 sccm, setting the pressure chamber at between about 50 m Torr and about 500 m Torr, and setting a substrate DC bias between about −50 VDC and about −600 VDC. The conductive area of the substrate chuck can be changed by a factor X which leads to a change in RF power by the same factor X.

In still another preferred embodiment, a method for fabricating a thermally stable diamond-like carbon film can be carried out by the operating steps of first providing a plasma enhanced chemical vapor deposition chamber of the parallel plate type, positioning a wafer on a substrate chuck that has a conductive area between about 300 cm² and about 700 cm² and maintaining a gap between the wafer and a top electrode between about 1 cm and about 10 cm, flowing a precursor gas of a cyclic hydrocarbon into the chamber over the wafer which is kept at a temperature between about 60° C. and about 200° C., at a flow rate between about 25 sccm and about 100 sccm while keeping the chamber pressure at between about 100 m Torr and about 300 m Torr, depositing a diamond-like carbon film on the wafer under a RF power density between about 0.25 W/cm² and about 0.8 W/cm² while under a wafer DC bias between about −100 VDC and about −400 VDC, and annealing the diamond-like carbon film at a temperature of not less than 300° C. for at least 0.5 hour. The method may further include the step of annealing the film at a temperature of not higher than 300° C. for a first time period and then at a temperature not lower than 380° C. for a second time period wherein the second time period is longer than the first time period. The second time period may be set at least 10 folds of the first time period. The cyclic hydrocarbon precursor can be either cyclohexane or benzene.

The present invention is further directed to an electronic structure which has layers of insulating materials as intralevel or interlevel dielectrics in a back-end-of-the-line interconnect structure which includes a pre-processed semiconducting substrate that has a first region of metal embedded in a first layer of insulating material, a first region of conductor embedded in a second layer of insulating material which comprises diamond-like carbon, said second layer of insulating material being in intimate contact with said first layer of insulating material, said first region of conductor being in electrical communication with said first region of metal, and a second region of conductor being in electrical communication with said first region of conductor and being embedded in a third layer of insulating material comprises diamond-like carbon, said third layer of insulating material being in intimate contact with said second layer of insulating material. The electronic structure may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxinitride, refractory metal silicon nitride, where the refractory metal is from the coup comprising Ta, Zr, Hf, W, silicon carbide, silicon carbooxide, modified diamond-like carbon and their hydrogenated compounds. The first and the second dielectric cap layer may be selected from the same group of dielectric materials. The first layer of insulating material may be silicon oxide or silicon nitride or doped varieties of these materials, such as PSG or BPSG. The electronic structure may further include a diffusion barrier layer of a dielectric material deposited on at least one of the second and third layer of insulating material. The electronic structure may further include a dielectric on top of the second layer of insulating material, which acts as a RIE hard mask and polish stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE hard mask/diffusion barrier layer on top of the first dielectric polish-stop layer, a second dielectric RIE hard mask/polish-stop layer on top of the third layer of insulating material, and a second dielectric diffusion barrier layer on top of the second dielectric polish-stop layer. The electronic structure may further include a dielectric cap layer of same materials as mentioned above between an interlevel dielectric of diamond-like carbon and an intralevel dielectric of diamond-like carbon.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention discloses a method for fabricating a thermally stable carbon-based low dielectric constant film such as a hydrogenated amorphous carbon film or a diamond-like carbon film in a parallel plate plasma enhanced chemical vapor deposition chamber. A precursor gas of a cyclic hydrocarbon such as cyclohexane or benzene can be used for forming the diamond-like carbon film. The carbon-based low dielectric constant film should be heat treated at a temperature not less than 300° C. for at least 0.5 hour to improve its thermal stability. To produce a low stress, thermally stable carbon-based film, a specific geometry of the deposition chamber with specific growth conditions are necessary. For instance, in the parallel plate reactor, a conductive area of the substrate chuck should be between about 300 cm$^2$ and about 700 cm$^2$, with a gap between the substrate and a top electrode between about 1 cm and about 10 cm. A RF power is applied to the substrate. The present invention advantageous carbon-based low dielectric constant films can only be formed from a cyclic hydrocarbon precursor such as cyclohexane or benzene in a specifically configured reaction chamber under specific reaction conditions.

The present invention therefore discloses a method for preparing thermally stable diamond-like carbon films that have low dielectric constant, e.g., smaller than 3.6, that are suitable for integration in the back-end-of-the-line wiring structure. The films can be prepared by choosing a suitable precursor and a specific combination of processing parameters as described below.

Figure 1:
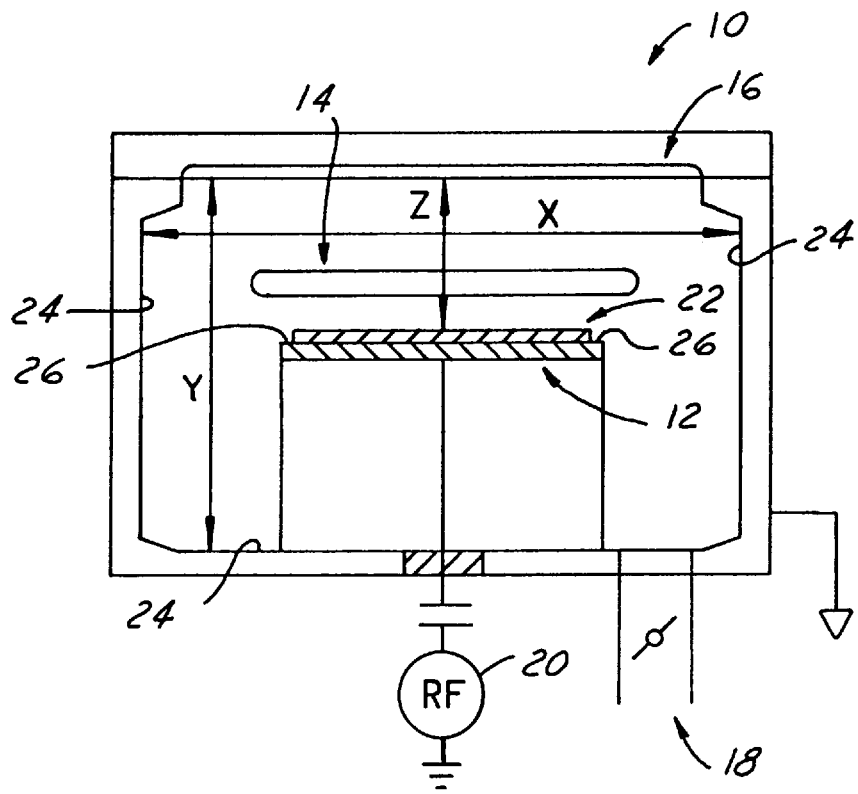
FIG. 1 is a cross-sectional view of the present invention parallel plate chemical vapor deposition chamber.

Referring initially to FIG. 1, wherein a cross-sectional view of a present invention parallel plate chemical vapor deposition chamber 10 is shown. It should be noted that the schematic of the chemical vapor deposition chamber 10 shown in FIG. 1 does not depict all the necessary internal components within the chamber. Instead, FIG. 1 is presented for providing geometrical features which are important in obtaining the best combination of the deposition parameters. As shall be described in detail below, the processing parameters which must be controlled during the DLC deposition are the RF power, or substrate bias voltage, the chamber pressure, the precursor gas flow rate and the substrate temperature during deposition. The value of the substrate bias voltage is determined uniquely by the RF power, the chamber pressure, the gas flow rate and the reactor geometry.

As shown in FIG. 1, the parallel plate plasma enhanced chemical vapor deposition chamber 10 is the type used for processing 200 mm wafers. The inner diameter X of the chamber 10 is approximately 13 inches while its height Y is approximately 8.5 inches. The diameter of the substrate chuck 12 is approximately 10.8 inches. Reactant gases are introduced into the reactor 10 through a gas distribution plate (GDP) 16 which is spaced apart from the substrate chuck 12 by a gap Z of 3.5 inches and are exhausted out of the chamber through a 3 inch exhaust port 18. The RF power 20 is connected to the substrate chuck 12 and transmitted to the substrate 22. All other parts in chamber 10 are grounded such that the substrate 22 acquires a negative bias voltage having a value dependent upon the reactor geometry and the plasma parameters.

The surfaces 24 of the chamber 10 are normally coated with an insulating coating material. For instance, one specific type of coating is applied on the chamber walls 24 to a thickness of several mils. Another type of coating material is used on the gas distribution plate 16 and the substrate chuck 12 which is a thch is resistant to etch by oxygen plasma. The only electrically conductive component that is exposed to the plasma in the present invention chamber configuration is the substrate 22 to be coated and the substrate support ring 26. The diameter of the conductive area provided, i.e., the diameter of the substrate support ring 26 is about 8.2 inches. The temperature of the chamber wall surfaces 24 is fixed at about 60° C. The substrate temperature is maintained by utilizing backside helium cooling at a pressure of about 8 Torr.

The main process variables controlled during a deposition process for DLC are the RF power, the cyclohexane flow rate, the chamber pressure and the substrate temperature. The following is an implementation example for the deposition of a 1 μm DLC film.

EXAMPLE 1

In this implementation example, a wafer is first prepared by introducing the wafer into chamber 10 through a slit valve 14 and pre-etching the wafer by argon gas. In this wafer preparation process, the wafer temperature is set at about 60° C. and the argon flow rate is set at about 25 sccm to achieve a pressure of about 100 m Torr. A RF power is then turned on to about 125 W for about 60 seconds. The RF power and the argon gas flow are then turned off.

The diamond-like carbon film can be deposited by first establishing a cyclohexane gas flow to a desired flow rate and pressure, i.e., at about 25 sccm and about 100 m Torr. A RF power is then turned on at about 200 W for a time period of about 5 minutes. The RF power and the gas flow are then turned off. The wafer is then removed from the reaction chamber 10.

To improve the thermal stability of the diamond-like carbon films, i.e., to make them stable at temperatures greater than 300° C., the films are post annealed to either evaporate the volatile contents and to dimensionally stabilize the films or just dimensionally stabilize the films. The post annealing process can be carried out in an annealing furnace by the following steps. The furnace is first purged for 5 minutes (with the film samples in a load station) with nitrogen at a flow rate of 10 liters/minute. The film samples are then transferred into the furnace chamber to start the post annealing cycle of first heating the films to 280° C. at a heating rate of 5° C./minute, holding at 280° C. for 5 minutes, then heating at a second heating rate of 5° C./minute to 400° C., holding at 400° C. for 4 hours, then the furnace is turned off and the film samples are allowed to cool to a temperature of below 100° C. A suitable first holding temperature may be between about 280° C. and about 300° C., while a suitable second holding temperature may be between about 300° C. and about 400° C.

The diamond-like carbon films may also be stabilized by a rapid thermal annealing (RTA) process. The DLC films obtained by the present invention process are characterized by dielectric constants k<3.6, and are thermally stable for integration in a back-end-of-the-line interconnect structure which is normally processed at temperatures of up to 400° C. The present invention novel process can therefore be easily adapted in producing DLC films as intralevel and interlevel dielectrics in back-end-of-the-line processes for logic and memory devices.

After each deposition cycle, the deposition chamber should be cleaned by utilizing a oxygen plasma. A cleaning wafer is first introduced into the PECVD chamber 10 and placed on chuck 12, an oxygen flow of 300 sccm is then established to achieve a chamber pressure of 100 m Torr. A magnetic field is then turned on at 30 Gauss and a RF power is turned on at 325 W. An etching process for the total removal of DLC films from the chamber walls is then carried out with 10% over etch.

It should be emphasized that the present invention novel method is only possible by utilizing a deposition chamber that has a specific geometry with uniquely defined growth conditions. When a chamber of different geometry is used under the defined growth conditions, the carbon-based films produced may not be thermally stable and off low stress. For instance, the present invention parallel plate reactor should have a conductive area of the substrate chuck of between about 300 cm$^2$ and about 700 cm$^2$, and preferably between about 500 cm$^2$ and about 600 cm$^2$. The gap between the substrate and the gas distribution plate (or top electrode) is between about 1.5 cm and about 10 cm, and preferably between about 7 cm and about 9 cm. A RF power is applied to the substrate through the substrate chuck at a frequency between about 12 MHZ and about 15 MHZ, and preferably at about 13.56 MHZ.

The deposition conditions utilized are also critical to enable the successful implementation of the present invention deposition process. For instance, a wafer temperature at between about 25° C. and about 325° C., and preferably at between about 60° C. and about 200° C. should be used. A RF power density between about 0.05 W/cm$^2$ and about 1.0 W/cm$^2$, and preferably between about 0.25 W/cm$^2$ and about 0.8 W/cm$^2$ should be utilized. The reactant gas flow rate of cyclohexane should be between about 5 sccm and about 200 sccm, and preferably between about 25 sccm and about 100 sccm. The chamber pressure during the deposition process is kept between about 50 m Torr and about 500 m Torr, and preferably between about 100 m Torr and about 300 m Torr. The reactor geometry as described above enables a substrate DC bias voltage to be established under the described processing conditions at between about −50 VDC and about −600 VDC, and preferably between about −100 VDC and about −400 VDC.

It should be noted that a change in the area of the substrate chuck by a factor X, i.e., a change from a value in the range between 300 cm$^2$ and 700 cm$^2$, will change the RF power by a factor X from that previously specified and thus keeping the RF density in the range previously specified and preserving the substrate bias voltage in the same desirable range. Similarly, a change in the area of the substrate chuck by a factor Y, and a change in the gap between the gas distribution plate and the substrate chuck by a factor Z from that previously specified will be associated with a change by a factor YZ in the gas flow rate from that previously specified and will preserve the substrate bias voltage in the desirable range as previously described.

The deposited DLC films are stabilized before undergoing further integration processing. The stabilization process can be performed in a furnace annealing step at 300 to 400° C. for a time period between about 0.5 and about 4 hours. The stabilization process can also be performed in a rapid thermal annealing process at temperatures above 300° C. The dielectric constant of the DLC films obtained according to the present invention novel process are lower than 3.6. The thermal stability of the DLC films obtained according to the present invention process in non-oxidizing ambient is up to a temperature of 400° C.

The electronic devices formed by the present invention novel method are shown in FIGS. 2~5. It should be noted that the devices shown in FIGS. 2~5 are merely illustrated as examples of the present invention method while indefinite number of other devices can also be formed by the present invention novel method.

Figure 2:
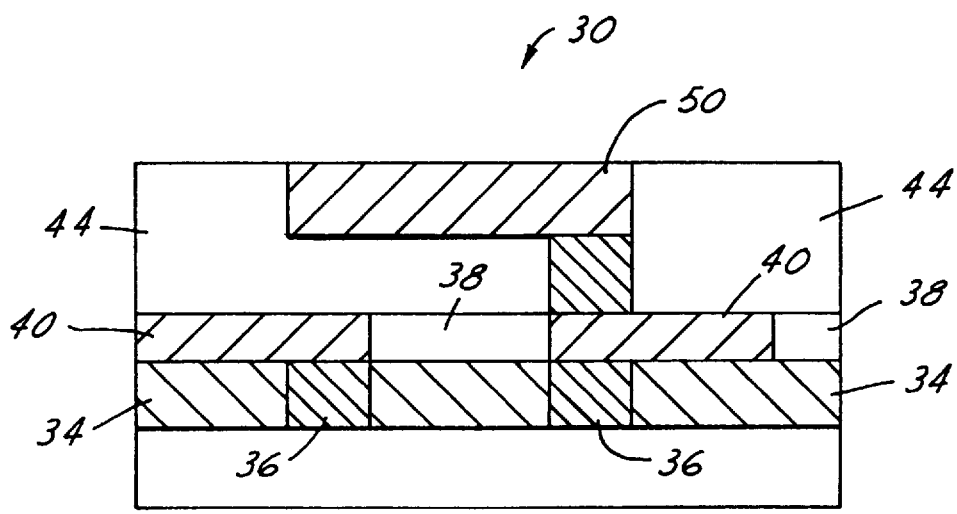
FIG. 2 is an enlarged, cross-sectional view of a present invention electronic device having an intralevel dielectric layer and an interlevel dielectric layer of diamond-like carbon.

In FIG. 2, an electronic device 30 is shown which is built on a silicon substrate 32. On top of the silicon substrate 32, an insulating material layer 34 is first formed with a first region of metal 36 embedded therein. After a CMP process is conducted on the first region of metal 36, a carbon-based film such as a diamond-like carbon film 38 is deposited on top of the first layer of insulating material 34 and the first region of metal 36. The first layer of insulating material 34 may be suitably formed of silicon oxide, silicon nitride, doped varieties of these materials, or any other suitable insulating materials. The diamond-like carbon film 38 is then patterned in a photolithography process and a conductor layer 40 is deposited therein. After a CMP process on the first conductor layer 40 is carried out, a second layer of diamond-like carbon film 44 is deposited by a plasma enhanced chemical vapor deposition process overlying the first diamond-like carbon film 38 and the first conductor layer 40. The conductor layer 40 may be deposited of a metallic conductive material or a non-metallic conductive material. For instance, a metallic material of aluminum or copper, or a non-metallic material such as nitride or polysilicon. The first conductor 40 is in electrical communication with the first region of metal 36.

A second region of conductor 50 is then formed after a photolithographic process in the second diamond-like carbon film layer 44 is conducted followed by a deposition process for the second conductor material. The second conductor 50 may also be deposited of either a metallic material or a non-metallic material, similar to that used in depositing the first conductor layer 40. The second region of conductor 50 is in electrical communication with the first region of conductor 40 and is embedded in the second layer of diamond-like carbon insulator 44. The second layer of diamond-like carbon film is in intimate contact with the first layer of insulating material 38. In this specific example, the first layer of insulating material 38 of diamond-like carbon is an intralevel dielectric material, while the second layer of insulating material, i.e., the diamond-like carbon film 44 in both an intralevel and an interlevel dielectric. Based on the low dielectric constant of the diamond-like carbon film, superior insulating property can be achieved by the first insulating layer 38 and the second insulating layer 44.

Figure 3:
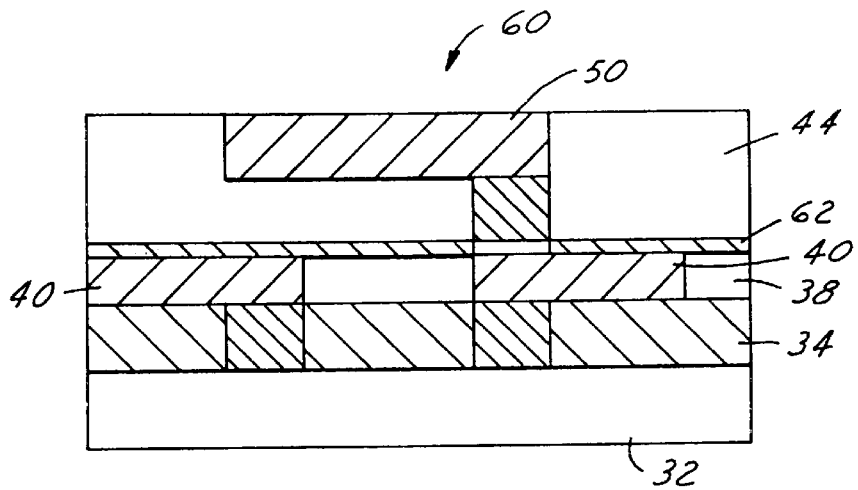
FIG. 3 is an enlarged, cross-sectional view of the present invention electronic structure of FIG. 2 having an additional diffusion barrier dielectric cap layer on top of the diamond-like carbon film.

FIG. 3 shows a present invention electronic device 60 similar to that of electronic device 30 shown in FIG. 2, but with an additional dielectric cap layer 62 deposited between the first insulating material layer 38 and the second insulating material layer 44. The dielectric cap layer 62 can be suitably formed of a material such as silicon oxide, silicon nitride, silicon oxinitride, refractory metal silicon nitride, where the refractory metal is from the group comprising Ta, Zr, Hf, W, silicon carbide, silicon carbo-oxide (SiCO), modified diamond-like carbon and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 4:
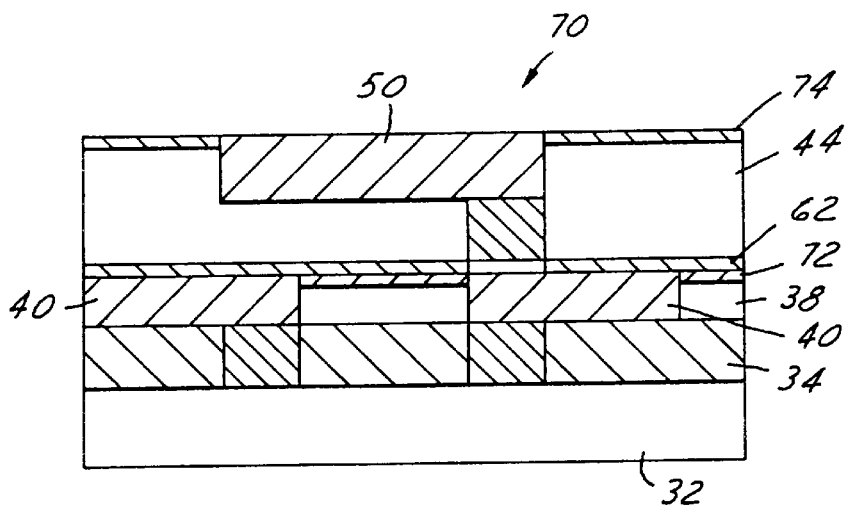
FIG. 4 is an enlarged, cross-sectional view of the present invention electronic structure of FIG. 3 having an additional RIE hard mask/polish stop dielectric cap layer with and dielectric cap diffusion barrier on top of the polish-stop layer.

Another alternate embodiment of the present invention electronic device 70 is shown in FIG. 4. In the electronic device 70, two additional dielectric cap layers 72 and 74 which act as an RIE mask and CMP (chemical mechanical polishing) polish stop layer are used. The first dielectric cap layer 72 is deposited on top of the first insulating material (DLC) layer 38. The function of the dielectric layer 72 is to provide an end point for the chemical mechanical polishing process utilized in planarizing the first conductor layer 40. The polish stop layer 72 can be deposited of a suitable dielectric material such as silicon oxide, silicon nitride, silicon oxinitride, refractory metal silicon nitride, where the refractory metal is from the group comprising Ta, Zr, Hf, W, silicon carbide, silicon carbo-oxide (SiCO), modified diamond-like carbon and their hydrogenated compounds. The top surface of the dielectric layer 72 is at the same level as the first conductor layer 40. A second dielectric layer 74 can be added on top of the second insulating material (DLC) layer 44 for the same purposes.

Figure 5:
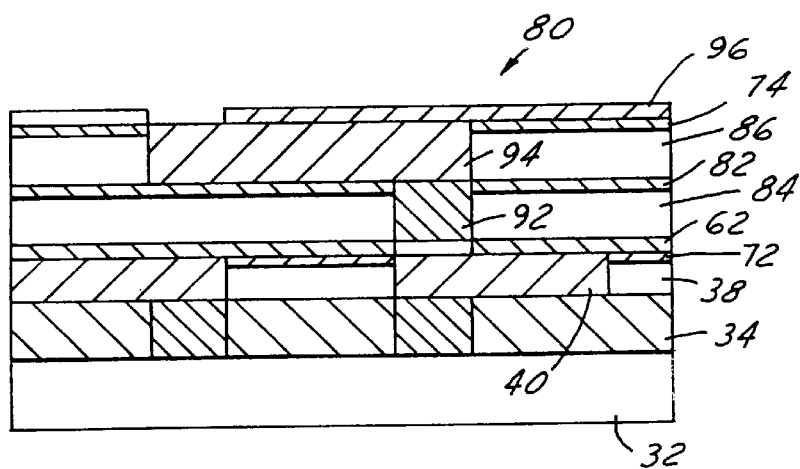
FIG. 5 is an enlarged, cross-sectional view of the present invention electronic structure of FIG. 4 having additional RIE hard mask/polish stop dielectric layers on top of the interlevel diamond-like carbon film.

Still another alternate embodiment of the present invention electronic device 80 is shown in FIG. 5. In this alternate embodiment, an additional layer of dielectric 82 is deposited and thus dividing the second insulating material layer 44 into two separate layers 84 and 86. The intralevel and interlevel dielectric layer 44, shown in FIG. 4, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefits provided by this alternate embodiment electronic structure 80 is that dielectric layer 82 acts as an RIE etch stop providing superior interconnect depth control.

The present invention novel method and the electronic structures formed by such method have therefore been amply demonstrated in the above descriptions and in the appended drawings of FIGS. 1~5. It should be emphasized that the examples of the present invention electronic structures shown in FIGS. 2~5 are merely used as illustrations for the present invention novel method which, obviously, can be applied in the fabrication of an infinite number of electronic devices.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed is:

1. A method for fabricating a thermally stable diamond-like carbon film comprising the steps of:

providing a parallel plate plasma enhanced chemical vapor deposition chamber, positioning a wafer on a substrate chuck having a conductive area between about 300 $cm^2$ and about 700 $cm^2$, and maintaining a gap between the wafer and a top electrode between about 1 cm and about 10 cm, flowing a precursor gas of a cyclic hydrocarbon into said chamber over said wafer kept at a temperature between about 25° C. and about 325° C. at a flow rate between about 5 sccm and about 200 sccm while keeping said chamber pressure between about 50 m Torr and about 500 m Torr, depositing a diamond-like carbon film on said wafer under a RF power density between about 0.05 $W/cm^2$ and about 1.0 $W/cm^2$ while under a wafer DC bias between about −50 VDC and about −600 VDC, and annealing said diamond-like carbon film at a temperature not less than 300° C. for at least 0.5 hour to form the thermally stable carbon-based low dielectric constant film.

2. A method for fabricating a thermally stable carbon-based low dielectric constant film according to claim 1, wherein a change in the conductive area of said substrate chuck by a factor X changes a RF power by a factor X.

3. A method for fabricating a thermally stable carbon-based low dielectric constant film according to claim 1, wherein a change in the area of the substrate chuck by a factor Y and a change in the gap between the gas distribution plate and the substrate chuck by a factor Z changes a gas flow rate by a factor of YZ such that the substrate bias voltage is maintained.

4. A method for fabricating a thermally stable diamond-like carbon film according to claim 1 further comprising the step of annealing said film at a temperature not higher than 300° C. for a first time period and then annealing said film at a temperature not lower than 300° C. for a second time, said second time period being longer than said first time period.

5. A method for fabricating a thermally stable diamond-like carbon film according to claim 4, wherein said second time period being at least 10 folds of said first time period.

6. A method for fabricating a thermally stable diamond-like carbon film according to claim 1, wherein said cyclic hydrocarbon is selected from the group consisting of cyclohexane and benzene.

7. A method for fabricating a thermally stable diamond-like carbon film comprising the steps of:

providing a parallel plate plasma enhanced chemical vapor deposition chamber, positioning a wafer on a substrate chuck having a conductive area between about 500 $cm^2$ and about 600 $cm^2$, and maintaining a gap between the wafer and a top electrode between about 7 cm and about 9 cm, flowing a precursor gas of a cyclic hydrocarbon into said chamber over said wafer kept at a temperature between about 60° C. and about 200° C. at a flow rate between about 25 sccm and about 100 sccm while keeping said chamber pressure between about 100 m Torr and about 300 m Torr, depositing a diamond-like carbon film on said wafer under a RF power density between about 0.25 $W/cm^2$ and about 0.8 $W/cm^2$ while under a wafer DC bias between about −100 VDC and about −400 VDC, and annealing said diamond-like carbon film at a temperature not less than 300° C. for at least 0.5 hour to form the thermally stable diamond-like carbon film.

8. A method for fabricating a thermally stable diamond-like carbon film according to claim 7, wherein a change in the conductive area of the substrate chuck by a factor X changes a RF power by a factor X.

9. A method for fabricating a thermally stable diamond-like carbon film according to claim 7, wherein a change in the area of the substrate chuck by a factor Y and a change in the gap between the gas distribution plate and the substrate chuck by a factor Z changes a gas flow rate by a factor of YZ such that the substrate bias voltage is maintained.

10. A method for fabricating a thermally stable diamond-like carbon film according to claim 7 further comprising the step of annealing said film at a temperature not higher than 300° C. for a first time period and then annealing said film at a temperature not lower than 300° C. for a second time, said second time period being longer than said first time period.

* * * * *